(12) United States Patent
Fujiwara

(10) Patent No.: US 8,258,625 B2
(45) Date of Patent: Sep. 4, 2012

(54) SEMICONDUCTOR DEVICE

(75) Inventor: Shinichi Fujiwara, Kamakura (JP)

(73) Assignee: Hitachi, Ltd., Tokyo (JP)

( * ) Notice: Subject to any disclaimer, the term of this patent is extended or adjusted under 35 U.S.C. 154(b) by 324 days.

(21) Appl. No.: 12/061,735

(22) Filed: Apr. 3, 2008

(65) Prior Publication Data
US 2008/0251914 A1 Oct. 16, 2008

(30) Foreign Application Priority Data

Apr. 6, 2007 (JP) ................. 2007-100777
Nov. 19, 2007 (JP) ................. 2007-299110

(51) Int. Cl.
*H01L 23/48* (2006.01)
(52) U.S. Cl. ........ 257/737; 257/738; 257/778; 257/784; 257/E23.021; 257/E23.023
(58) Field of Classification Search .......... 257/737, 257/738, 778, 784, E23.021, E23.023
See application file for complete search history.

(56) References Cited

U.S. PATENT DOCUMENTS

| | | | |
|---|---|---|---|
| 6,340,607 B1* | 1/2002 | Yamada | 438/106 |
| 6,409,866 B1* | 6/2002 | Yamada | 156/219 |
| 2002/0121706 A1 | 9/2002 | Tatsuta et al. | |
| 2003/0151140 A1* | 8/2003 | Nishiyama et al. | 257/737 |
| 2004/0099959 A1* | 5/2004 | Tang | 257/778 |
| 2004/0168824 A1* | 9/2004 | Sekido | 174/256 |

FOREIGN PATENT DOCUMENTS

| | | |
|---|---|---|
| JP | H07-201917 A | 8/1995 |
| JP | 2002-134541 | 5/2002 |
| JP | 2002-270647 | 9/2002 |
| JP | 2003-059959 | 2/2003 |
| JP | 2004-079710 | 3/2004 |
| JP | 2005-243714 | 9/2005 |

OTHER PUBLICATIONS

Office Action in Korean Pat. Appln. No. 10-2008-30724, dated Jan. 29, 2010; (6 pgs., in Korean).
Tanida, K. et al, "Micro Cu Bump Interconnection on 3D Chip Stacking Technology." Japanese Journal of Applied Physics, vol. 32, No. 48, pp. 2264-2270. [The Japan Society of Applied Physics], Apr. 27, 2004.
Chinese Office Action in Chinese Patent Appln. No. 2008100900654, dated Feb. 6, 2009 and Japanese translation.

* cited by examiner

*Primary Examiner* — Andy Huynh
(74) *Attorney, Agent, or Firm* — Antonelli, Terry, Stout & Kraus, LLP.

(57) ABSTRACT

In a structure for connecting a semiconductor element having a fine pitch electrode at 50 μm pitch or less and a pad or wirings on a substrate, for preventing inter-bump short-circuit or fracture of a connected portion due to high strain generated upon heating or application of load during connection, the substrate and the semiconductor element are connected by way of a bump having a longitudinal elastic modulus (Young's modulus) of 65 GPa or more and 600 GPa or less and a buffer layer including one of tin, aluminum, indium, or lead as a main ingredient and, further, protrusions are formed to at least one of opposing surfaces of the bump and the pad or the wirings on the substrate to each other, and the surfaces are connected by ultrasonic waves.

16 Claims, 7 Drawing Sheets

SEMICONDUCTOR DEVICE

The present application claims priority from Japanese applications JP2007-100777 filed on Apr. 6, 2007 and JP2007-299110 filed on Nov. 19, 2007, the contents of which are hereby incorporated by reference into this application.

BACKGROUND OF THE INVENTION

1. Field of the Invention

The present invention concerns a semiconductor device for home electronics or domestic equipments and for industrial use.

2. Description of the Related Art

A demand for higher functions has been increased year by year mainly for portable electronic equipments and, correspondingly, semiconductor devices of higher speed and higher capacity have been required. On the other hand, there is also a large requirement for decreasing the size of equipments and semiconductor packages capable of compatibilizing them have been developed. As an important technology for attaining the purpose, flip-chip mounting of connecting a semiconductor element by a protruding bump has been noted and they have already been used for various packages. The flip-chip mounting is a mounting system of connecting a chip having a bump formed on a pad onto an electrode of a substrate by a face-down method.

The flip-chip mounting system includes advantages, compared with an existent wire bonding connection system, that delay of signal transmission can be suppressed by shortening the connection length to enable high speed transmission and that reduction in the size is possible since the chip size is a package size. Predominant flip-chip mounting system includes, mainly, a solder bump connection system of connecting a chip and a substrate by a solder bump, an Au bump/solder connection system of forming a gold stud bump on the chip side and then connecting the stud bump and the wirings on the substrate with a solder, an ultrasonic connection method of forming a gold stud bump on the chip side and then connecting the stud bump and the wirings on the substrate by ultrasonic connection (refer to FIG. 7), and a contact connection system of forming a stud bump on the chip side and then connecting the stud bump and wirings on the substrate with a material mainly including a silver paste or a resin material such as ACF (Anisotropic Conductive Film).

On the other hand, a bump pitch has been made finer, and connection at 20 μm pitch has been announced for inter-chip connection of chip lamination package. While this is restricted at present only to the chip lamination package, it is expected that further refinement is conducted also on the connection between chip/substrate in the feature. Japanese Unexamined Patent Publication No. 2005-243714 and 2002-134541 describes a manufacturing method and a connection method of an electrode bump used for chip lamination which uses a structure of forming the bump top end so as to undergo larger stress change than that of the bump base portion, thereby causing buckling deformation to the bump top end to lower the stress upon connection.

SUMMARY OF THE INVENTION

Fine connection at a 50 μm pitch or less in the existent connection system described above for two or more members with a difference of the linear expansion coefficient includes the following problems.

(1) Solder Bump Connection System

It is necessary to heat the bump to a melting temperature of a solder or higher upon connection and it is heated to about 240° C. in a case of a lead-free solder which has become predominant at present. Accordingly, when a temperature is lowered to a room temperature after connection, deformation and strain occur to the solder connection portion due to the difference of the linear expansion coefficient between the members to be connected to generate inter-bump short-circuit or rupture of the connection portion due to high strain. Further, in a case of attaining the 50 μm pitch or less, it is desirable that the solder bump is 30 μm or less, but manufacture of a fine pump is extremely difficult in the current process. Further, since the inter-member height after connection is about 20 μm, it is difficult to fill an underfill between the members.

(2) Au Bump/Solder Connection System

Since it is necessary to melt the solder in the same manner as in the solder-bump connection system, when the temperature is lowered to a room temperature after connection, deformation and strain occur in the solder connection portion due to the difference of the linear expansion coefficient between members to be connected to possibly generate inter-bump short-circuit or fracture of the connection portion due to high strain. Particularly, since the amount of the solder is less than that of the bump connection, it is anticipated that the rate of occurrence of fracture increases. Further, there may be a risk of stress concentration on the gold bump/chip pad. Further, it is difficult to uniformly form a gold stud bump of 30 μm or less while suppressing scattering in the height.

(3) Ultrasonic Connection System

In a case of the ultrasonic connection system, since the connection temperature is as low as 150° C. or lower, short-circuit or fracture in the connection portion due to temperature change as described above less occurs. However, since a load has to be applied upon connection, deformation is caused in the gold stud bump upon loading to possibly cause short-circuit between adjacent bumps.

(4) Contact Connection System

In the contact connection system, while the connection temperature is suppressed to about 150° C., since the connection form is a contact form, the connection resistance increases making high speed transmission difficult. Further, for using a silver paste or ACF for fine connection, it is necessary to select conductive particle product of several μm in diameter, which increases the cost.

In view of the above, application of the existent techniques as they are to the fine connection involves various subjects and development for new techniques has become necessary.

In JP-A No. 2005-243714, while the top end of the bump is deformed thereby making it possible to absorb the load upon connection, the contact resistance increases for the connection between members of different linear expansion coefficient since this is contact connection and it is not suitable. Further, since heating to 150° C. to 400° C. is necessary, deformation or strain in the connection portion increases due to the difference of the linear expansion coefficient to result in a problem for the connection between different materials.

In view of the above, the present invention intends to provide a semiconductor device of a high reliability and capable of coping with high speed transmission in a structure of connecting a semiconductor element having a fine pitch electrode at 50 μm pitch or less to a pad or wirings on a substrate, by preventing inter-bump short-circuit generated upon heating or application of load during connection or rupture of a connected portion due to high strains, or by lowering a contact resistance.

The present invention provides, in a main aspect, a semiconductor device concerning a structure of connecting a semiconductor element having a fine pitch electrode at 50 μm pitch or less with a pad or wirings on a substrate, in which the substrate and the semiconductor element are connected by way of a bump with a longitudinal elastic modulus (Young's modulus) of 65 GPa or more and 600 GPa or less and a buffer layer including one of tin, aluminum, indium, and lead as a main ingredient, and protrusions are formed to at least one opposing surfaces of the bump and to the pad or the wirings on the substrate.

By the provision of the protrusions described above, lateral stress caused upon connection of the bump and the pad or the wirings during connection can be moderated to prevent or moderate movement of a material constituting the buffer layer. Further, low temperature connection is possible by connection with ultrasonic waves.

The invention has features in that a stress buffer layer can be ensured easily between the bump and the wirings, the distance of the connection portion (connection height h1) is high, the stress buffer layer is provided, a hard bump is provided and low temperature connection such as ultrasonic connection is possible.

This can decrease the stress concentration on the connected portion due to the temperature change even in a case of connecting a substrate having a difference in the linear expansion coefficient. Further, since the temperature difference is small between the connection temperature and the room temperature, initial stress to the connected portion just after manufacture can be decreased. Further, since the distance for the connection portion is wide, an underfill can be injected easily. In addition, since a hard bump with unevenness is used, bump deformation due to the load during connection is decreased and inter-bump short circuit can be prevented.

DETAILED DESCRIPTION OF THE PREFERRED EMBODIMENTS

The present invention is to be described by way of preferred embodiments with reference to the drawings.

Embodiment 1

Figure 1:
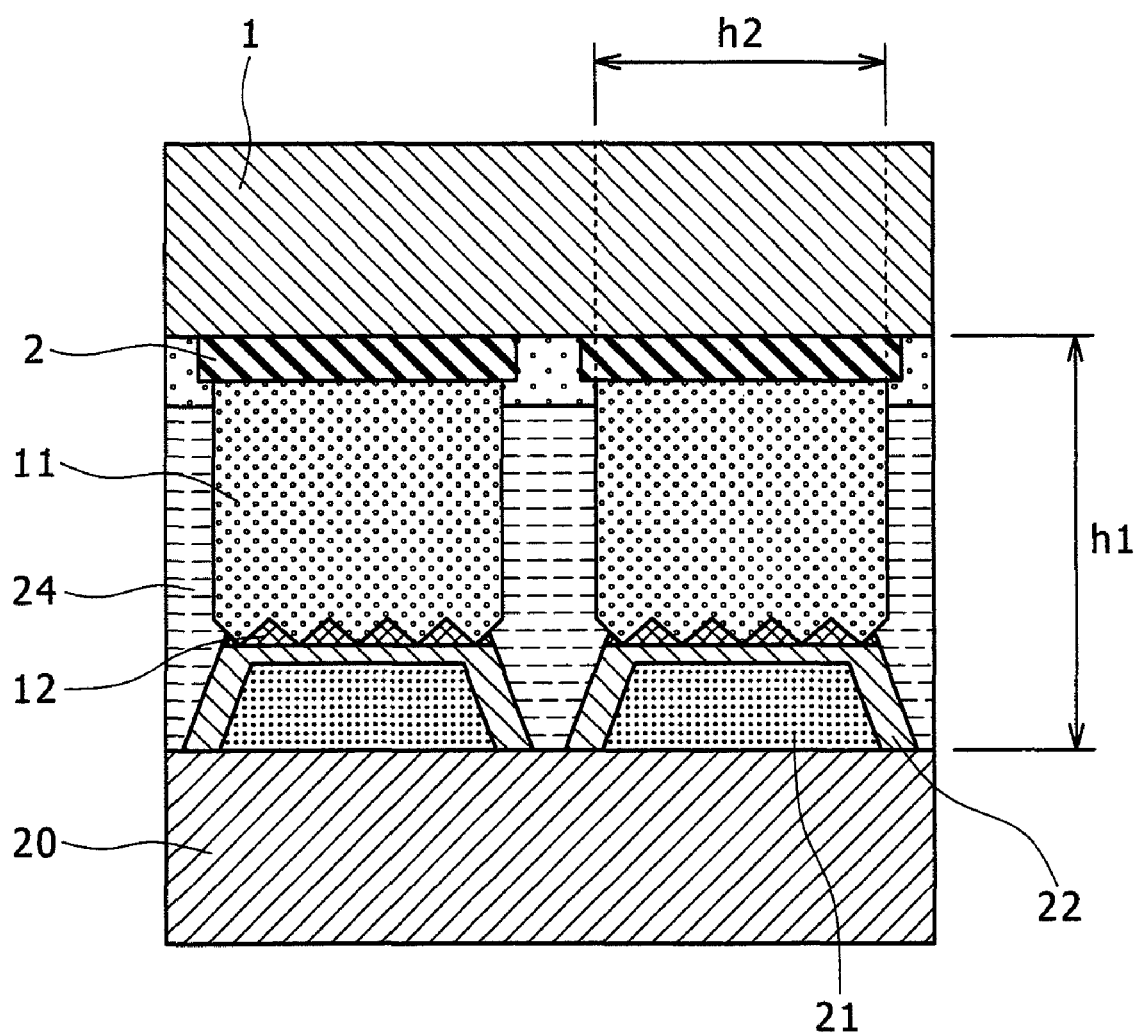
FIG. 1 is an enlarged cross sectional view for a fine connected portion of a first embodiment of the invention.

FIG. 1 is a schematic cross sectional view for a connected portion of a first embodiment of the invention, in which are shown a semiconductor element 1, a chip side pad 2, a bump 11, a buffer layer 12, a substrate 20, wirings 21, plating 22 on the wirings and an underfill 24.

The bump 11 has a longitudinal elastic modulus of 65 GPa or more and 600 GPa or less and includes a metal as a main ingredient, for example, at least one of nickel, copper, aluminum, gold and titanium as a main ingredient. Further, so long as an entire pump has a longitudinal elastic modulus of 65 GPa or more, it may be a composite body, for example, a laminate structure of copper and nickel. In this case, the longitudinal elastic efficient for the entire bump 11 is defined as 65 GPa or more because the factor giving an effect on the reliability of the connected portion in a structure of connecting materials of different linear expansion coefficient is a shearing strain $\epsilon$ for the connected portion, and the shearing strain $\epsilon$ is represented as: $\epsilon = \Delta\alpha \cdot \Delta T \cdot L/d$ assuming L as a distance from the center, d as a connection height, $\Delta\alpha$ as a difference of linear expansion coefficient between both of the members, and $\Delta T$ as the amount of temperature change. As the connection height d is higher, the strain decreases, that is, the reliability is improved more. Accordingly, in the connection structure of this embodiment, while the height cannot be ensured in the case of using elemental tin or solder (Young's modulus of about 17 to 30 MPa), the height can be ensured by using a metal bump with a longitudinal elastic modulus of 65 GPa or more (for example, aluminum: 68 GPa) and the reliability of connection can be improved. Unevenness is formed to the top end of the bump 11.

The buffer layer 12 includes one of tin, indium, lead, and aluminum as the main ingredient which may be any material having a longitudinal elastic modulus lower than that of a selected bump material 11.

The buffer layer 12 may be formed either on the bump 11 or the wiring 21, or may be formed independently to a thickness of 2 to 3 μm (structure formed previously neither to the chip side bump nor the substrate side wiring but put between the bump and the wiring). The buffer material 12 may be any material so long as it includes one of tin, indium, lead, and aluminum as a main ingredient and has a longitudinal elastic modulus lower than that of the selected bump material 11.

The substrate 20 may be any of a resin substrate, ceramic substrate, or silicon substrate. The wirings 21 and the plating 22 on the wirings has constitution used generally for various substrates and, for example, the wirings 21 include copper and the plating 22 on the wiring includes nickel or gold plating in a case of a resin substrate. In the first embodiment, description is to be made for the substrate 20 as a printed substrate. Unevenness is formed to the bump 11 on the side of the material to be connected. In the first embodiment of FIG. 1, while a corrugating unevenness is illustrated, the shape of the unevenness formed on the bump 11 is not restricted so long as it has a height capable of ensuring the buffer layer 12 to at least one portion between the bump 11 and the plating 22 on the wirings upon connection with the plating 22 on the wirings. Further, the unevenness formed to the bump 11 may be formed to the plating 22 on the wirings or may be formed to both of the bump 11 and the plating 22 on the wirings.

Figure 2:
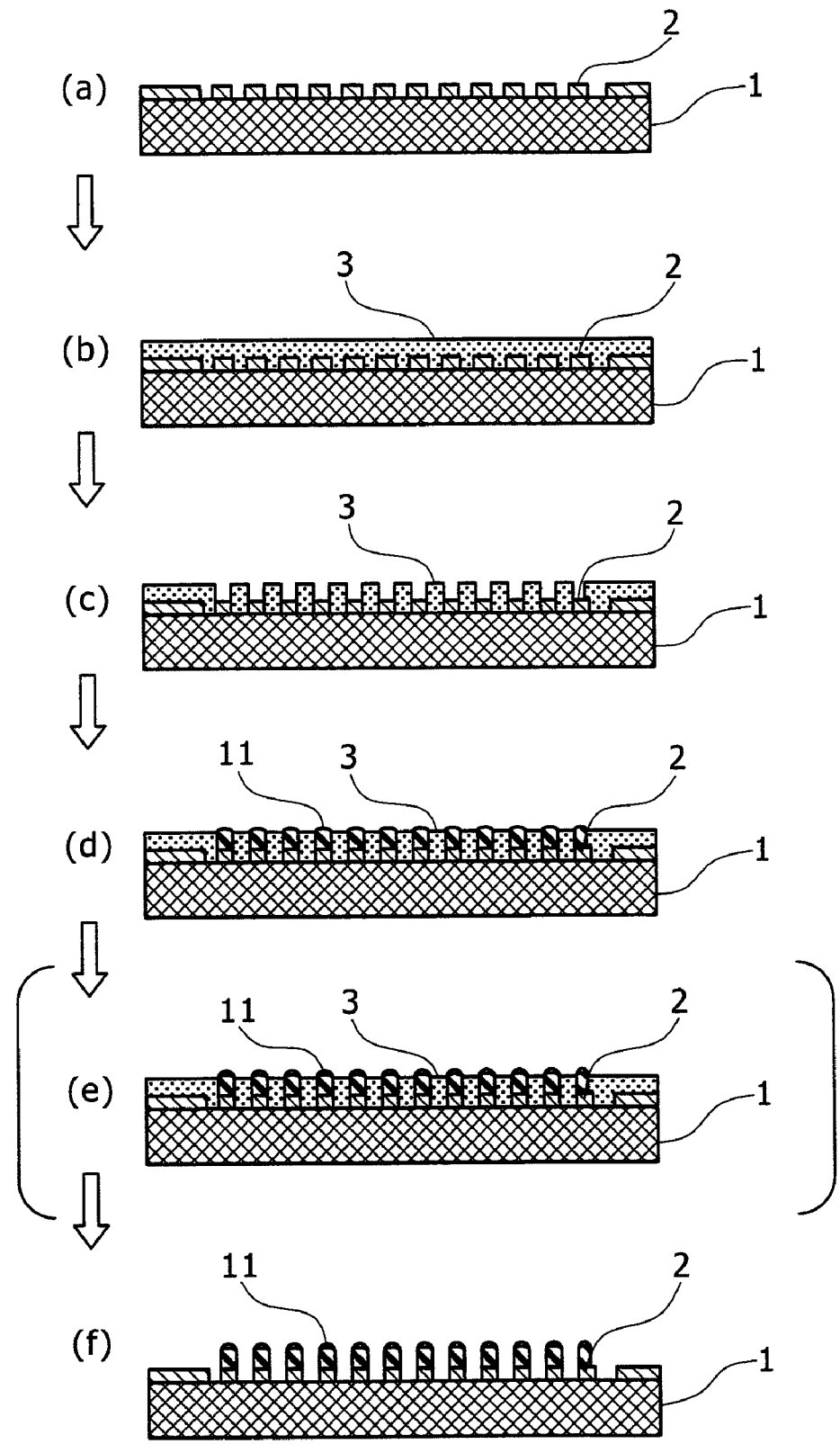
FIG. 2 is a cross sectional view as an example of a bump forming process on a semiconductor element of the invention.
Figure 3:
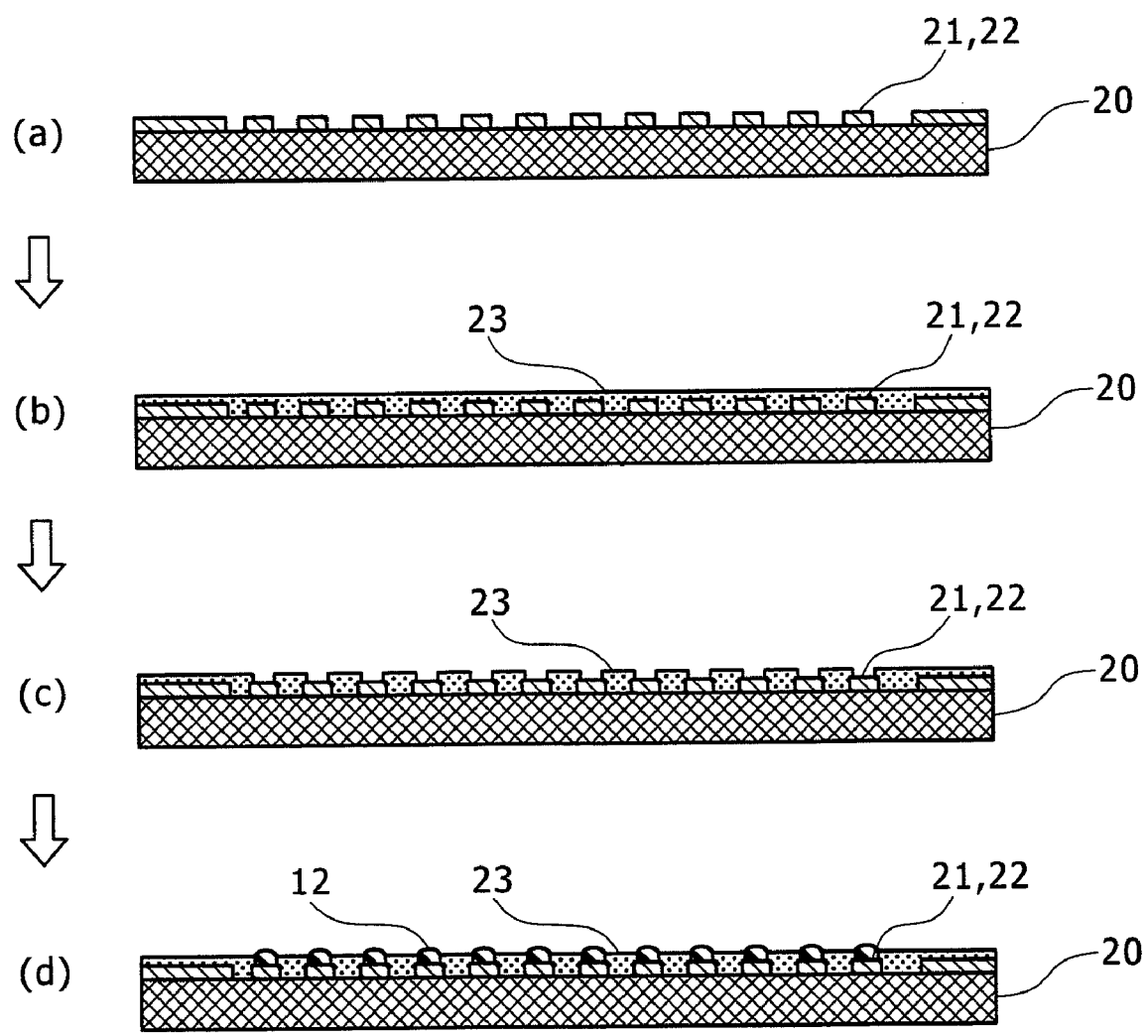
FIG. 3 is a cross sectional view of an example of a buffer layer forming process on a substrate of the invention.

FIG. 2 shows an example of a process for forming a bump on the side of the semiconductor element 1 of the first embodiment. In FIG. 2 and FIG. 3, description is to be made to an example of using a metal mainly including aluminum for the pad 2 on the chip side, a metal mainly including nickel for the bump 11, a metal mainly including tin for the buffer layer 12, a metal mainly including copper for the wirings and gold plating on a metal mainly including nickel for the plating 22 on the wirings.

To the semiconductor element 1, a chip side pad 2 and wirings (not illustrated) are formed as shown in FIG. 2(a). As a pretreatment for plating nickel on the chip side pad 2, a zincate treatment for zinc substitution is applied after etching the surface. Then, as shown in FIG. 2(b), a resist 3 is coated, exposed and developed to form openings to predetermined forming portions of the bump 11 (FIG. 2(c)). As the resist 3 either a negative resist or a positive resist may be used. Further, the thickness of the resist 3 is made equal with or higher than the desired bump height. A nickel pump is formed to the thus formed openings by way of electroless plating (FIG. 2(d)). Unevenness of 1 to 15 μm is formed to the top end of the thus formed nickel pump. An example for the method of forming the unevenness is shown below.

A first method of forming the unevenness at the top end of the bump is a method of forming the unevenness by pressing to a die. Unevenness of a desired height intended to be formed on the bump 11 (1 to 15 μm) is formed to the surface of a jig formed of a material or surface coated with a material of a higher hardness than that of the bump 11. For forming the unevenness, while a method such as mechanical polishing, etching, laser fabrication, plasma fabrication or cutting may be used, and it is preferred to select means suitable to the fabrication of the jig material. By opposing the structure of FIG. 2(d) to the jig and applying a load from above, unevenness is formed on the bump 11. While the resist may be removed upon forming the protrusions, the resist can prevent damages to the wirings, etc. other than the bump 11. After forming the unevenness on the bump 11, gold is formed to 0.01 μm to 5 μm on the surface of nickel by vapor deposition, sputtering, plating or the like. Gold may be formed only when it is necessary. Finally, as shown in FIG. 2(f), the resist 3 is removed thereby obtaining the semiconductor element 1 formed with the bump 11. While the forming process by electroless plating is shown in this embodiment, electrolytic plating may also be used. Further, the forming method is not restrictive but a bump transfer method or a thin film forming process utilized in MEMS (Micro Electro Mechanical Systems) may also be used for instance.

The second method of forming the unevenness at the top end of the bump is a method of utilizing dry etching. As the dry etching method, a method of utilizing the chemical reaction such as reactive gas etching, reactive ion etching, reactive ion beam etching or reactive laser beam etching or a method of etching of simultaneously taking place chemical reaction and physical reaction by collision of ions such as ion milling may be used. From the state shown in FIG. 2(d), the unevenness of 1 to 15 μm is formed on the bump 11 by any of the methods described above. The shape of the convex portion may be in any shape such as a circular, square, polygonal, spherical, and elliptic shape so long as it can be formed to at least one portion on the surface of the bump 11. While the resist may be removed upon forming the protrusion, the resist can prevent damages to wirings, etc. other than the bump 11. After forming the unevenness on the bump 11 by dry etching, gold is formed to 0.01 μm to 5 μm to the surface of the nickel by vapor deposition, sputtering or plating. Gold may be formed only when it is necessary. Finally, as shown in FIG. 2(f) the resist 3 is removed to obtain the semiconductor element 1 formed with the bump 11. While the forming process by the electroless plating is shown in this embodiment, electrolytic plating may also be used.

A third method of forming the unevenness on the top end of the bump is a method of utilizing wet etching. The wet etching method is a process of dipping a work into a chemical that chemically attacks or dissolves a metal or the like or spraying such a chemical to the work to be fabricated into an optional shape, by which a great amount of works can be fabricated at once at a reduced cost. From the state shown in FIG. 2(d), unevenness of 1 to 15 μm is formed on the bump 11 by the wet etching method. The shape of the convex portion may be in any shape such as a circular, square, polygonal, spherical or elliptic shape so long as it can be formed to at least one portion on the surface of the bump 11. While the resist may be removed upon forming the protrusion, the resist can prevent damages to wirings, etc. other than the bump 11. After forming the unevenness on the bump 11 by wet etching, gold is formed to 0.01 μm to 5 μm to the surface of the nickel by vapor deposition, sputtering, or plating. Gold may be formed only when it is necessary. Finally, as shown in FIG. 2(f), the resist 3 is removed to obtain a semiconductor element 1 formed with the bump 11. While the forming process by the electroless plating is shown in this embodiment, electrolytic plating may also be used. While description has been made to the bump forming method by the plating process, the forming method is not restrictive but a bump transfer method or a bump formation method utilizing the MEMS process may also be used.

A fourth method of forming the unevenness on the top end of the bump is a method of utilizing laser fabrication. The type of the laser can be selected depending on the target material, including, for example, solid laser such as YAG laser and ruby laser, gas laser such as carbonic acid gas laser, argon ion laser and helium neon laser, liquid laser, semiconductor laser, and free electron laser. Since formation of the unevenness using the laser enables fine fabrication, it has an advantage capable of fabrication also to a complicate shape. From the state shown in FIG. 2(d), unevenness of 1 to 15 μm is formed on the bump 11 by laser. The shape of the convex portion may be in any shape such as a circular, square, polygonal, spherical or elliptic shape so long as it can be formed to at least one portion on the surface of the bump 11. While the resist may be removed upon forming the protrusion, the resist can prevent damages to wirings, etc. other than the bump 11. After forming the unevenness on the bump 11 by laser, gold is formed to 0.01 μm to 5 μm to the surface of the nickel by vapor deposition, sputtering, or plating. Gold may be formed only when it is necessary. Finally, as shown in FIG. 2(f) the resist 3 is removed to obtain the semiconductor element 1 formed with the bump 11. While the forming process by the electroless plating is shown in this embodiment, electrolytic plating may also be used.

While description has been made to the bump forming method by the plating process, the forming method is not restrictive but a bump transfer method or a bump formation method utilizing the MEMS process may also be used. A fifth method of forming the unevenness on the top end of the bump is a method of utilizing sputtering. Sputtering is a technique of colliding argon ionized in vacuum against a surface to be fabricated thereby conducting surface fabrication or film deposition. The method includes a method of setting a sample in the state of FIG. 2(d) to a vacuum chamber and fabricating the upper surface of the bump 11 with ionized argon, thereby forming unevenness of 1 to 15 μm and a method of forming optional protrusions on the bump by a sputter film deposition apparatus. The shape of the convex portion may be in any shape such as a circular, square, polygonal, spherical or elliptic shape so long as it can be formed to at least one portion on the surface of the bump 11. While the resist may be removed upon forming the protrusion, the resist can prevent damages to wirings, etc. other than the bump 11. After forming the unevenness on the bump 11 by sputtering, gold is formed to 0.01 μm to 5 μm to the surface of the nickel by vapor deposition, sputtering or plating. Gold may be formed only when it is necessary. Finally, as shown in FIG. 2(f) the resist 3 is removed to obtain the semiconductor element 1 formed with the bump 11. While the forming process by the electroless plating is shown in this embodiment, electrolytic plating may also be used.

While description has been made to a bump forming method by the plating process, the forming method is not restrictive but, for example, the bump transfer method or the bump forming method utilizing the MEMS process may also be used. A sixth method of forming the unevenness on the top end of the bump is a method of utilizing polishing. The sample in the state of FIG. 2(d) is polished by polishing paper to form unevenness of 1 to 15 μm on the bump 11. Polishing paper having such a grain size that the unevenness is within a range described above is used. Fabrication by the polishing paper has an advantage in that the fabrication is extremely easy. While the resist may be removed upon forming the protrusion, the resist can prevent damages to wirings, etc. other than the bump 11 and prevent cracking of the bump 11 due to stress during polishing. After forming the unevenness on the bump 11 by polishing, gold is formed to 0.01 μm to 5 μm to the surface of the nickel by vapor deposition, sputtering or plating. Gold may be formed only when it is necessary. Finally, as shown in FIG. 2(f) the resist 3 is removed to obtain a semiconductor element 1 formed with the bump 11. While the forming process by the electroless plating is shown in this embodiment, electrolytic plating may also be used.

While description has been made to the bump forming method by the plating process, the forming method is not restrictive but, for example, the bump transfer method or the bump forming method utilizing the MEMS process may also be used. While description has been made to a method of forming the unevenness on the side of the semiconductor element 1 in the unevenness forming method described above, same effect can also be obtained by forming the unevenness to the plating 22 on the wirings on the side of the substrate 20. FIG. 3 shows an example of a process of forming a buffer layer 12 on the side of a substrate in the first embodiment. In FIG. 3(a), copper wirings 21 and nickel plating are formed on the printed substrate 20. Then, after coating a resist 23, openings are formed to a portion for forming the buffer layer 12 by exposure and development (FIG. 3 (c)). As the resist 23, either a negative resist or a positive resist may be used. Finally, tin plating is formed to the openings by an electric plating or electroless plating method thereby capable of forming a printed substrate having the buffer layer 12. The resist may optionally be removed. The thickness of tin plating formed in this embodiment is formed such that the total sum h1 of the chip side pad 2, the bump 11, the thickness of the tin plating and the thickness of the plating 22 on the wirings formed on the side of the semiconductor element 1 is longer than the pad diameter h2 on the side of the chip. h2 shows the size of the opening perforated to the film formed at the inside of the pad outer circumference formed on the semiconductor element so as to cover the portion above the pad. The shape of the opening includes a case of a circular or rectangular shape, and h2 means the diameter in the case of the former and means the length of the shorter side in a case of the latter. Further, tin plating may be formed by dipping.

Figure 4:
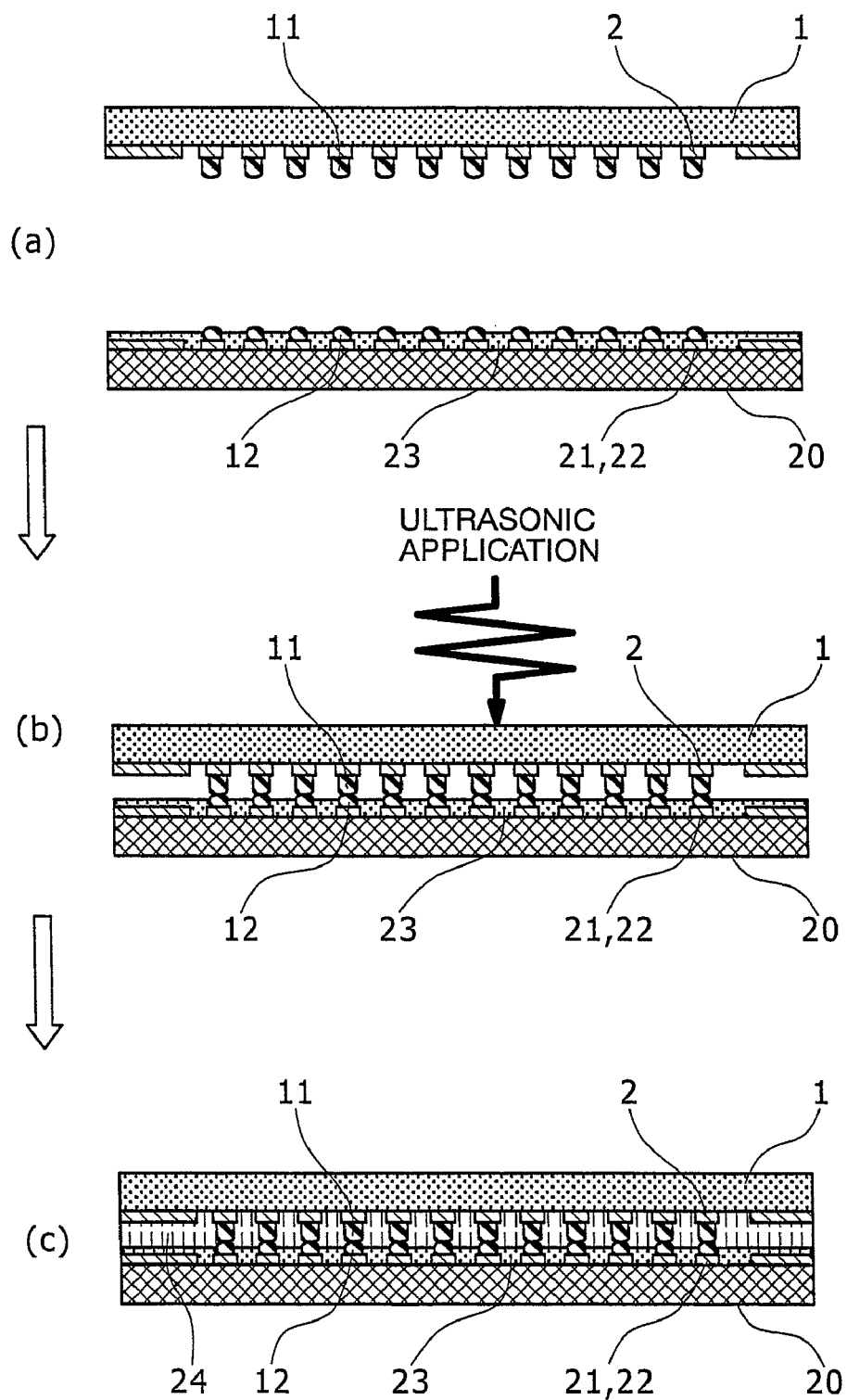
FIG. 4 is a cross sectional view of an example of an assembling process of the invention.
Figure 5:
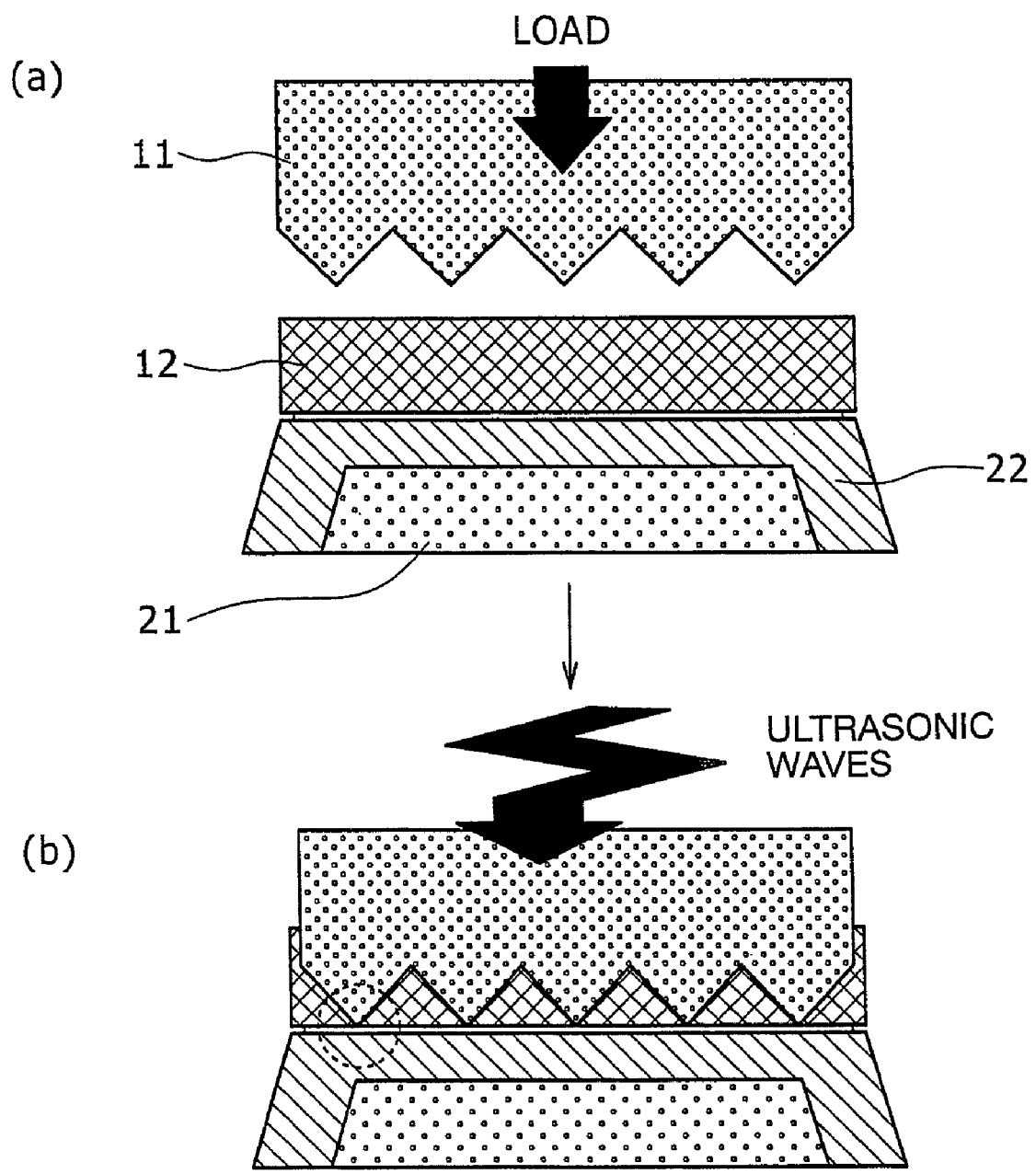
FIG. 5 is an enlarged cross sectional view for a fine connected portion in an ultrasonic application process of the invention.

FIG. 4 shows an example of a package forming process of the first embodiment. At first as shown in FIG. 4(a), a buffer layer 12 on the side of a substrate and a bump 11 on the side of a chip are positioned to each other. By cleaning the buffer layer 12 on the side of the substrate before connection, connection property can be improved. After positioning, ultrasonic connection is conducted while applying heating and pressurization. The heating temperature is set such that the temperature for the connecting portion is at a room temperature or higher and 150° C. or lower. FIG. 5 shows a connected portion upon application of supersonic waves in an enlarged scale. In the ultrasonic connection process, members to be in contact with are at first brought closer by applying a load and then ultrasonic waves are generated while applying the load, oxide films or contaminant films at the surface of the members to be in contact are removed to expose the fresh surface and both of them are subjected to solid phase diffusion to ensure the connection. By forming the protrusions to the bump 11, even when an initial load is applied, the buffer layer 12 can be interposed between the bump 11 and the plating 22 on the wirings. Accordingly, a load higher than that in the case with no protrusion can be applied making it possible to further shorten the distance between the members to be in contact with each other. Further, since the oxide film on the buffer layer 12 is removed by application of ultrasonic waves also for the bump 11 and the buffer layer 12 and for the buffer layer 12 and the plating 22 on the wirings to expose fresh surfaces, connection by solid phase diffusion is conducted by which electric connection is expected. Finally, an underfill 24 is interposed between the semiconductor element 1 and the substrate 20 to reinforce the connected portion and prevent contamination to the connected portion thereby completing the package.

The feature of this embodiment resides in that the stress buffer layer can be ensured easily between the bump and the wirings, the distance for the connected portion (connection height h1) is high, the stress buffer layer is provided, a hard bump is provided and low temperature connection such as ultrasonic connection is possible. Since the stress buffer layer can be ensured easily, the initial load can be increased and since the distance between the members to be in contact with each other can be made shorter easily, so that oxide films or contaminate films can be removed easily upon application of ultrasonic waves. Further, since the distance for the connected portion is large, this provides an advantage capable of decreasing the concentration of the stress on the connected portion due to the temperature change and capable of injecting the underfill easily even in a case of connecting substrate members having the difference of linear expansion coefficient. By the provision of the stress buffer layer, the stress generated during manufacture and in a working circumstance can be moderated in the connected portion compared in a case of usual ultrasonic connection system. By the provision of the hard bump, bump deformation due to the load upon connection can be decreased to prevent inter-bump short-circuit. Since this is a low temperature connection by ultrasonic connection and, accordingly, the difference between the connection temperature and the room temperature is small, the initial stress to the connected portion just after the production can be decreased.

As has been described above, this embodiment provides various effects and can attain a semiconductor device having a connection structure at high reliability. In the first embodiment, while the description has been made to an example of forming a nickel bump and a gold plating on the side of the semiconductor element 1 and forming a tin buffer layer on the side of the substrate, the nickel bump may also be formed on the side of the substrate and tin may be formed on the side of the semiconductor element 1. Further, as the buffer layer 12, an alloy mainly including aluminum may also be used.

Embodiment 2

Figure 6:
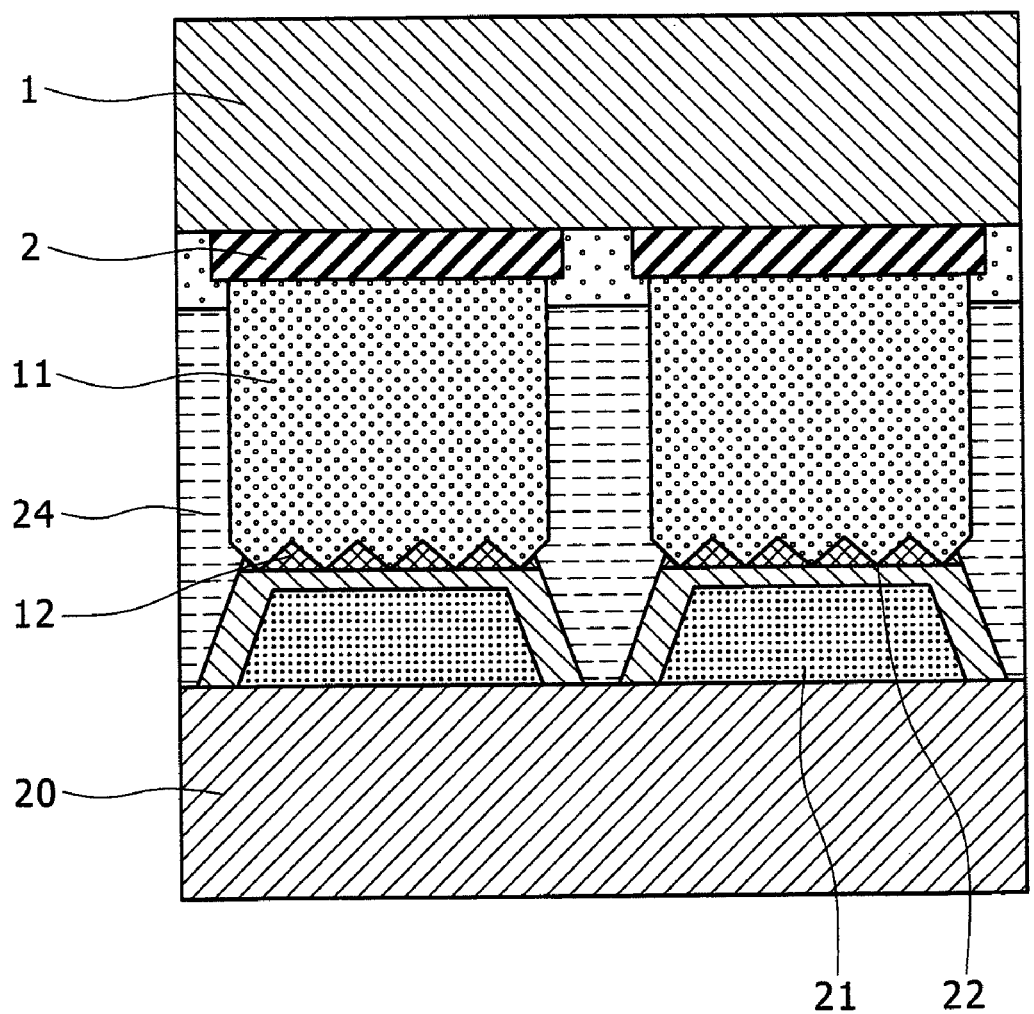
FIG. 6 is an enlarged cross sectional view for a fine connected portion of a second embodiment of the invention.
Figure 7:
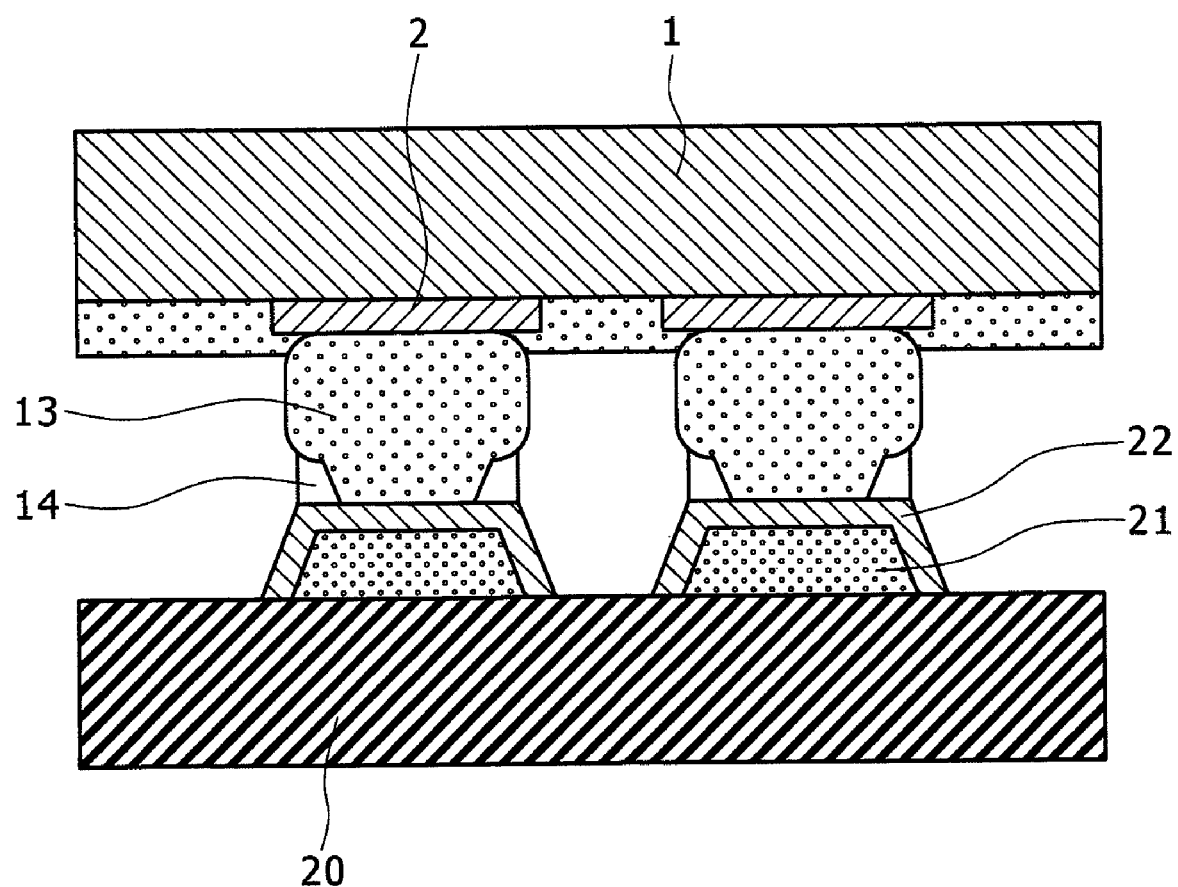
FIG. 7 is an enlarged cross sectional view for an existent connected portion using a gold stud bump.

FIG. 6 is a schematic cross sectional view of a second embodiment in which are shown a semiconductor element 1, a chip side pad 2, a bump 11, a buffer layer 12, a substrate 20, wirings 21, plating 22 on the wirings and an underfill 24.

The bump 11 has a longitudinal elastic modulus of 65 GPa or more and 600 GPa or less and including a metal as a main ingredient and including, for example, at least one of nickel, copper, aluminum, gold, and titanium as a main ingredient. Further, the bump 11 may be a composite body so long as the longitudinal elastic modulus of the entire bump is 65 GPa or more and may be, for example, a laminate structure of copper and nickel.

The buffer layer 12 includes one of tin, indium, lead, and aluminum as a main ingredient, and may be any material having a longitudinal elastic modulus lower than that of the selected bump material 11. The substrate 20 may be a resin substrate, a ceramic substrate, a silicon substrate, or the like.

The wirings 21 and the plating 22 on the wirings have a constitution used generally for various substrates and, for example, the wirings 21 include copper and the plating 22 on the wirings includes nickel or gold plating in a case of the resin substrate. The second embodiment has a structure of using a printed substrate as the substrate 20 and the unevenness is formed on the side of the substrate wirings.

A first method of forming the unevenness to the plating 22 on the wirings is a method of pressing to a die. Unevenness of a desired height intended to be formed on the plating 22 on the wiring (1 to 15 μm) is formed to the surface of a jig formed of a material or surface coated a material of higher hardness than that of the plating 22 on the wiring. For forming the unevenness, while any method such as mechanical polishing, etching, laser fabrication, plasma fabrication, or cutting may be used, it is preferred to select a method suitable to the fabrication of the jig material. The unevenness is formed to the plating 22 on the wirings by opposing the substrate of FIG. 3(a) to the jig and applying a load from above. Formation of the resist can prevent damages to the wirings or the like other than the plating 22 on the wirings. After forming the unevenness to the plating 22 on the wirings, tin is formed to the nickel surface. Tin may be formed on the side of the bump 11.

A second method of forming the unevenness to the plating 22 on the wirings is a method of utilizing dry etching. As the dry etching method, either a method of utilizing the chemical reaction such as reactive gas etching, reactive ion etching, reactive ion beam etching or reactive laser beam etching or a method of etching of simultaneously taking place chemical reaction and physical reaction by collision of ions such as ion milling may be used. From the state shown in FIG. 3(a), the unevenness of 1 to 15 μm is formed to the plating 22 on the wirings by any of the methods described above. The shape of the convex portion may be in any shape such as a circular, square, polygonal, spherical, and elliptic shape so long as it can be formed to at least one portion to the surface of the plating 22 on the wirings. While the resist may be removed upon forming the protrusion, the resist can prevent damages to wirings, etc. other than the plating 22 on the wirings. After forming the unevenness on the plating 22 on the wirings, tin may be formed to the surface of the nickel. Tin may be formed also on the side of the bump 11.

A third method of forming the unevenness to the plating 22 on the wirings is a method of utilizing wet etching. The wet etching method is a process of dipping a work into a chemical that chemically attacks or dissolves a metal or the like or spraying such a chemical to the work to be fabricated into an optional shape, by which a great amount of works can be fabricated at once at a reduced cost. From the state shown in FIG. 3(a), an unevenness of 1 to 15 μm is formed to the plating 22 on the wirings by the wet etching method. The shape of the convex portion may be in any shape such as a circular, square, polygonal, spherical or elliptic shape so long as it can be formed to at least one portion to the surface of the plating 22 on the wirings. While the resist may be removed upon forming the protrusion, the resist can prevent damages to wirings, etc. other than the plating 22 on the wirings. After forming the unevenness to the plating 22 on the wirings, tin is formed to the surface of nickel. Tin may be formed also on the side of the bump 11.

A fourth method of forming the unevenness to the plating 22 on the wirings is a method of utilizing laser fabrication. The type of the laser can be selected depending on the target material, including, for example, solid laser such as YAG laser and ruby laser, gas laser such as carbonic acid gas laser, argon ion laser and helium neon laser, liquid laser, semiconductor laser, and free electron laser. Since formation of the unevenness using the laser enables fine fabrication, it has an advantage capable of fabrication also to a complicate shape. From the state shown in FIG. 3(a), an unevenness of 1 to 15 μm is formed to the plating 22 on the wirings by laser. The shape of the convex portion may be in any shape such as a circular, square, polygonal, spherical or elliptic shape so long as it can be formed to at least one portion on the surface of the plating 22 on the wirings. While the resist may be removed upon forming the protrusion, the resist can prevent damages to wirings, etc. other than the plating 22 on the wirings. After forming the unevenness to the plating 22 on the wirings tin is formed to the surface of nickel. Tin may be formed also on the side of the bump 11.

A fifth method of forming the unevenness to the plating 22 on the wirings is a method of utilizing sputtering. Sputtering is a technique of colliding argon ionized in vacuum against a surface to be fabricated thereby conducting surface fabrication or film deposition. The method includes a method of setting a sample in the state of FIG. 3(a) to a vacuum chamber and fabricating the upper surface of the plating 22 on the wirings with ionized argon, thereby forming an unevenness of 1 to 15 μm and a method of forming optional protrusions on the bump by a sputter film deposition apparatus. The shape of the convex portion may be in any shape such as a circular, square, polygonal, spherical or elliptic shape so long as it can be formed to at least one portion on the surface of the plating 22 on the wirings. While the resist may be removed upon forming the protrusion, the resist can prevent damages to wirings, etc. other than the plating 22 on the wirings. After forming the unevenness on the plating 22 on the wirings, tin is formed to the surface of nickel. Tin may be formed also on the side of the bump 11. A sixth method of forming the unevenness on the plating 22 on the wirings is a method of utilizing polishing. The sample in the state of FIG. 3(a) is polished by polishing paper to form unevenness of 1 to 15 μm to the plating 22 on the wirings. Polishing paper having such a grain size that the unevenness is within a range described above is used. Fabrication by the polishing paper has an advantage in that the fabrication is extremely easy. While the resist may be removed upon forming the protrusion, the resist can prevent damages to wirings, etc. other than the plating 22 on the wirings and prevent cracking of the plating 22 on the wirings by the stress upon polishing.

After forming the unevenness on the plating 22 on the wirings by polishing, tin is formed to the surface of nickel. Tin may be formed also on the side of the bump 11. The first and the second embodiments are examples of forming the unevenness on the side of the bump 11, and on the side of the plating 22 on the wirings, the unevenness may also be formed to both the bump 11 and the wirings on the substrate.

Further, the forming process of the second embodiment may be a process identical with that of the first embodiment. The second embodiment includes, in addition to the feature of the first embodiment, that the semiconductor process can be simplified since the unevenness is not formed on the side of the semiconductor element 1, and the buffer layer 12 can be captured easily since the unevenness is present previously on the side of the wirings 22 on the substrate.

Further, in a case of setting the thickness of the buffer layer 12 to 5 μm or more, while the device can be manufactured by the process identical with that of Embodiments 1 or 2 described above, the stress buffering function is improved by increasing the thickness of the buffer layer 12, and the stress buffer layer is maintained for a long time while the compound at the connection boundary keeps to grow in the working circumstance since the initial buffer layer has a large thickness. As a result, the connection structure has higher reliability and semiconductor device having higher reliability can be attained.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A semiconductor device including a connection structure for connecting a fine pitch electrode at 50 μm pitch or less disposed on a semiconductor element and a pad or a wiring disposed on a substrate for mounting the semiconductor element,
    wherein the connection structure includes a structure connected on one side thereof to the fine pitch electrode and connected on the other side thereof to the pad or the wiring disposed on the substrate by way of a bump having a longitudinal elastic modulus (Young's modulus) of 65 GPa or more and 600 GPa or less and a buffer layer including at least one of tin, aluminum, indium, or lead as a main ingredient,
    wherein a protruding shape is provided on at least one of opposing surfaces of the bump and the pad or the wirings disposed on the substrate to provide unevenness to said at least one of the opposing surfaces,
    wherein the bump and the buffer layer are connected to one another by applying an ultrasonic wave in a state that a load is applied to the buffer layer disposed on the pad or the wiring, and
    wherein the bump and the pad or the wiring are connected to each other and the buffer layer is provided between the bump and the pad or the wiring and is comprised of a plurality of structures having a protruding shape corresponding to the protruding shape of the at least one surface of the bump or the pad or the wiring to provide unevenness to the buffer layer.

2. The semiconductor device according to claim 1, wherein a relation: h1≧h2 is satisfied where
    h1 represents the connection height between the surface of the semiconductor element where the fine pitch electrode is disposed and the surface of the substrate where the pad or the wiring are disposed, and
    h2 represents the connection diameter or the shorter side length of the bump.

3. The semiconductor device according to claim 1, wherein the bump is formed of a plurality of layers.

4. The semiconductor device according to claim 1, wherein the main material of the bump is one of nickel, copper, aluminum, gold and titanium.

5. The semiconductor device according to claim 1, wherein the buffer layer is formed on the bump, or on the pad or the wiring.

6. The semiconductor device according to claim 1, wherein the buffer layer is formed by using an electrolytic plating method or an electroless plating method.

7. The semiconductor device according to claim 1, wherein the buffer layer is formed by using a metal film interposed between the bump and the pad or the wiring.

8. The semiconductor device according to claim 1, wherein the connection of the semiconductor element and the bump or the buffer layer and the pad or the wiring is conducted by application of ultrasonic waves.

9. The semiconductor device according to claim 8, wherein the connection is conducted at a temperature in a range higher than a room temperature and equal to or lower than 150° C.

10. A semiconductor device including a connection structure for connecting a fine pitch electrode at 50 μm pitch or less disposed on a semiconductor element and a pad or wirings disposed on a substrate for mounting the semiconductor element,
    wherein the connection structure includes a structure connected on one side thereof to the fine pitch electrode and connected on the other side thereof to the pad or the wiring disposed on the substrate by way of a bump having a longitudinal elastic modulus (Young's modulus) of 65 GPa or more and 600 GPa or less and a buffer layer including at least one of tin, aluminum, indium, or lead as a main ingredient
    wherein the bump and the buffer layer are connected to one another by applying an ultrasonic wave in a state that a load is applied to the buffer layer disposed on the pad or the wiring, and
    wherein the bump and the pad or the wiring are connected to each other and the buffer layer is provided between the bump and the pad or the wiring and is comprised of a plurality of structures having a protruding shape corresponding to a protruding shape of at least one surface of the bump or the pad or the wiring to provide unevenness to the buffer layer and to the at least one surface of the bump or the pad or the wiring.

11. A semiconductor device including a connection structure of connecting a fine pitch electrode at 50 μm pitch or less disposed on a semiconductor element and a pad or a wiring disposed on a substrate,
    wherein the connection structure includes a bump, a buffer layer having a longitudinal elastic modulus lower than that of the bump, and a wiring thickness, and is formed such that a relation between connection height h1 between the semiconductor element and the substrate as the sum of the height of the bump, the height of buffer layer and the thickness of the wiring thickness, and h2 for the width (or connection diameter) of the bump is: h1≧h2,
    wherein the buffer layer is formed on the bump or on the pad,
    wherein the bump and the buffer layer are connected to one another by applying an ultrasonic wave in a state that a load is applied to the buffer layer disposed on the pad or the wiring, and
    wherein the bump and the pad or the wiring are connected to each other and the buffer layer is provided between the bump and the pad or the wiring and is comprised of a plurality of structures having a protruding shape corresponding to a protruding shape of at least one surface of the bump or the pad or the wiring to provide unevenness to the buffer layer and to the at least one surface of the bump or the pad or the wiring.

12. The semiconductor device according to claim 11, wherein the height of the buffer layer is 5 μm or more.

13. The semiconductor device according to claim 11, wherein the main ingredient of the buffer layer includes one of tin, aluminum, indium, or lead.

14. The semiconductor device according to claim 1, further comprising a plating layer formed on an upper surface of the pad or the wiring to thereby disposed between the buffer and said upper surface.

15. The semiconductor device according to claim 10, further comprising a plating layer formed on an upper surface of the pad or the wiring to thereby disposed between the buffer and said upper surface.

16. The semiconductor device according to claim 11, further comprising a plating layer formed on an upper surface of the pad or the wiring to thereby disposed between the buffer and said upper surface.

* * * * *